(12) United States Patent
Spieler et al.

(10) Patent No.: US 12,742,798 B2
(45) Date of Patent: Sep. 22, 2026

(54) PLANAR CURRENT SENSOR FOR POWER CONVERSION APPLICATIONS

(71) Applicant: VIRGINIA TECH INTELLECTUAL PROPERTIES, INC., Blacksburg, VA (US)

(72) Inventors: Matthias Spieler, Blacksburg, VA (US); Dong Dong, Blacksburg, VA (US); Rolando Burgos, Blacksburg, VA (US)

(73) Assignee: VIRGINIA TECH INTELLECTUAL PROPERTIES, INC., Blacksburg, VA (US)

(*) Notice: Subject to any disclaimer, the term of this patent is extended or adjusted under 35 U.S.C. 154(b) by 147 days.

(21) Appl. No.: 18/625,329

(22) Filed: Apr. 3, 2024

(65) Prior Publication Data

US 2025/0314678 A1 Oct. 9, 2025

(51) Int. Cl.
*G01R 15/18* (2006.01)
*H01F 27/28* (2006.01)

(52) U.S. Cl.
CPC ....... *G01R 15/181* (2013.01); *H01F 27/2804* (2013.01); *H01F 2027/2819* (2013.01)

(58) Field of Classification Search
CPC G01R 15/131; G01R 15/181; G01R 19/0092; H01F 27/2804; H01F 2027/2819
USPC .......................................................... 324/127
See application file for complete search history.

(56) References Cited

U.S. PATENT DOCUMENTS

| | | | | |
|---|---|---|---|---|
| 7,265,533 | B2 * | 9/2007 | Lightbody | H05K 1/0268 324/126 |
| 9,116,179 | B2 * | 8/2015 | Gilbert | G01R 19/28 |
| 11,335,649 | B2 * | 5/2022 | Wang | H01L 23/50 |
| 11,824,344 | B1 * | 11/2023 | Parkhideh | G01R 31/52 |
| 12,573,550 | B2 * | 3/2026 | Parsa Sirat | H01F 38/30 |
| 2020/0105463 | A1 * | 4/2020 | Urankar | H01F 38/38 |

OTHER PUBLICATIONS

A. D. Callegaro, J. Guo, M. Eull, B. Danen, J. Gibson, M. Preindl, B. Bilgin, and A. Emadi, “Bus bar design for high-power inverters,” IEEE Transactions on Power Electronics, vol. 33, No. 3, pp. 2354-2367, Mar. 2018.

C. Xiao, L. Zhao, T. Asada, W. G. Odendaal, and J. D. van Wyk, “An overview of integratable current sensor technologies,” in Proc. IEEE Applied Power Electronics Conference and Exposition (APEC), 2003, pp. 1251-1258.

(Continued)

*Primary Examiner* — Roberto Velez
(74) *Attorney, Agent, or Firm* — Perilla Knox & Hildebrandt LLP; James J. Rha

(57) ABSTRACT

An example printed circuit board (PCB) with integrated current sense includes a direct current (DC) bus including a first DC trace and a second DC trace. The PCB with integrated current sense further includes a planar Rogowski coil positioned between the first DC trace and the second DC trace and electrically separated from the first DC trace and the second DC trace. The planar Rogowski coil can extend beyond an edge-to-edge distance between a first side edge and a second side edge of the first DC trace in a first direction. The planar Rogowski coil can further extend beyond an edge-to-edge distance between a first edge and a second edge of the second DC trace in the first direction.

20 Claims, 5 Drawing Sheets

(56) References Cited

OTHER PUBLICATIONS

D. Koch, H. Bantle, J. Acuna, P. Ziegler, and I. Kallfass, "Design methodology for ultra-compact Rogowski coils for current sensing in low-voltage high-current GaN based DC/DC-converters," in Proc 23rd European Conference on Power Electronics and Applications (EPE'21 Ecce Europe), Sep. 2021, p. 1.

J. Walter, J. Acuña, and I. Kallfass, "Design and implementation of an integrated current sensor for a gallium nitride half-bridge," in Proc. PCIM Europe Conf 2018, Nuremberg, Germany, Jun. 2018.

J. Wang, Z. Shen, R. Burgos, and D. Boroyevich, "Design of a high-bandwidth Rogowski current sensor for gate-drive short-circuit protection of 1.7-KV SiC MOSFET power modules," in Proc. IEEE Energy Conversion Congress and Exposition (ECCE), 2015, pp. 104-111.

L. Zhao, J. D. van Wyk, and W. G. Odendaal, "Planar embedded pick-up coil sensor for integrated power electronic modules," in Proc. IEEE Applied Power Electronics Conference and Exposition (APEC), 2004, p. 945.

M. Spieler, C.-W. Chang, A. El-Refaie, M. H. Alvi, D. Dong, and R. Burgos, "A DC-bus planar Rogowski coil based current sensor for half-bridge applications," in Proc. IEEE 24th Workshop on Control and Modeling for Power Electronics (COMPEL), 2023, doi: 10.1109/COMPEL52896.2023.10221026.

M. Stecca, P. Tiftikidis, T. B. Soeiro, and P. Bauer, "Gate driver design for 1.2 kV SiC module with PCB integrated Rogowski coil protection circuit," in Proc. IEEE Energy Conversion Congress and Exposition (ECCE), 2021, doi: 10.1109/ECCE47101.2021.9595589.

P. S. Niklaus, D. Bortis, and J. W. Kolar, "Beyond 50 MHz bandwidth extension of commercial DC-current measurement sensors with ultra-compact PCB-integrated pickup coils," IEEE Transactions on Industry Applications, vol. 58, No. 4, pp. 2930-2943, Jul./Aug. 2022, doi: 10.1109/TIA.2022.3164865.

S. Mocevic, J. Wang, R. Burgos, D. Boroyevich, C. Stancu, M. Jaksic, and B. Peaslee, "Comparison between desaturation sensing and Rogowski coil current sensing for short-circuit protection of 1.2 kV, 300 A SiC MOSFET module," in Proc. IEEE Applied Power Electronics Conference and Exposition (APEC), 2018, pp. 2666-2673, doi: 10.1109/APEC2018.8402269.

S. Mocevic, J. Wang, R. Burgos, D. Boroyevich, M. Jaksic, C. Stancu, and B. Peaslee, "Comparison and discussion on short-circuit protections for silicon-carbide MOSFET modules: desaturation versus Rogowski switch-current sensor," IEEE Transactions on Industry Applications, vol. 56, No. 3, pp. 1123-1134, May/Jun. 2020, doi: 10.1109/ TIA.2020.2972816.

S. Mocevic, J. Wang, R. Burgos, D. Boroyevich, M. Jaksic, M. Teimor, and B. Peaslee, "Phase current sensor and short-circuit detection based on Rogowski coils integrated on gate driver for 1.2 kV SiC MOSFET half-bridge module," in Proc. IEEE Energy Conversion Congress and Exposition (ECCE), 2018, pp. 2472-2479, doi: 10.1109/ECCE.2018.8557388.

T. Guillod, D. Gerber, J. Biela, and A. Musing, "Design of a PCB Rogowski coil based on the PEEC method," in Proc. IEEE International Conference on Integrated Power Electronics Systems (CIPS), Nuremberg, Germany, Mar. 2012.

X. Zhao, R. Phukan, C.-W. Chang, D. Dong, R. Burgos, A. Plat, and D. Mustapha, "Design of Rogowski coil current sensor integrated with busbar and gate driver for 211 kW SiC-based three-level T-type inverter," in Proc. IEEE Energy Conversion Congress and Exposition (ECCE), 2022, doi: 10.1109/ECCE50734.2022.9947570.

Y. Kuwabara, K. Wada, J.-M. Guichon, J.-L. Schanen, and J. Roudet, "Bus Bar Embedded Rogowski Coil," Proc. IEEE (exact conference not specified in excerpt), 2018.

Y. Kuwabara, K. Wada, J.-M. Guichon, J.-L. Schanen, and J. Roudet, "Design of an Integrated Air Coil for Current Sensing," IEEE J. Emerg. Sel. Topics Power Electron., vol. 8, No. 4, pp. 4122-4129, 2020, doi: 10.1109/JESTPE.2020.2977102.

Y. Kuwabara, K. Wada, J.-M. Guichon, J.-L. Schanen, and J. Roudet, "Implementation and performance of a current sensor for a laminated bus bar," in Proc. IEEE Energy Conversion Congress and Exposition (ECCE), 2016, pp. 1-8.

Y. Xue, J. Lu, Z. Wang, L. M. Tolbert, B. J. Blalock, and F. Wang, "A Compact Planar Rogowski Coil Current Sensor for Active Current Balancing of Parallel-Connected Silicon Carbide MOSFETs," in Proc. IEEE Energy Conversion Congress and Exposition (ECCE), 2014, pp. 4685-4690.

K. Wang, X. Yang, H. Li, L. Wang, and p. Jain, "A High-Bandwidth Integrated Current Measurement for Detecting Switching Current of Fast GaN Devices," IEEE Transactions on Power Electronics, vol. 33, No. 7, pp. 6199-6210, Jul. 2018, doi: 10.1109/TPEL.2017.2749249.

* cited by examiner 20
306A
308A
260A
310A
260A
110
306C
308C
280
310C
280
306B
308B
260B
310B
260B
302
304
306
308
310
312
314
316

PLANAR CURRENT SENSOR FOR POWER CONVERSION APPLICATIONS

STATEMENT REGARDING FEDERALLY SPONSORED RESEARCH OR DEVELOPMENT

This invention was made with government support under grant number DE-EE0009190, awarded by U.S. Department of Energy (DOE). The government has certain rights in the invention.

BACKGROUND

A Rogowski coil is a type of electrical device used for measuring alternating current (AC) or high-speed current pulses in electrical systems. Traditional Rogowski coils can include a helical coil of wire wound around a hollow core. Planar Rogowski coils can include flat windings patterned on a substrate material, such as a printed circuit board (PCB). Planar Rogowski coils can be compact compared to traditional Rogowski coils, but integration of planar Rogowski coils into PCBs for power conversion applications may be difficult.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1A:
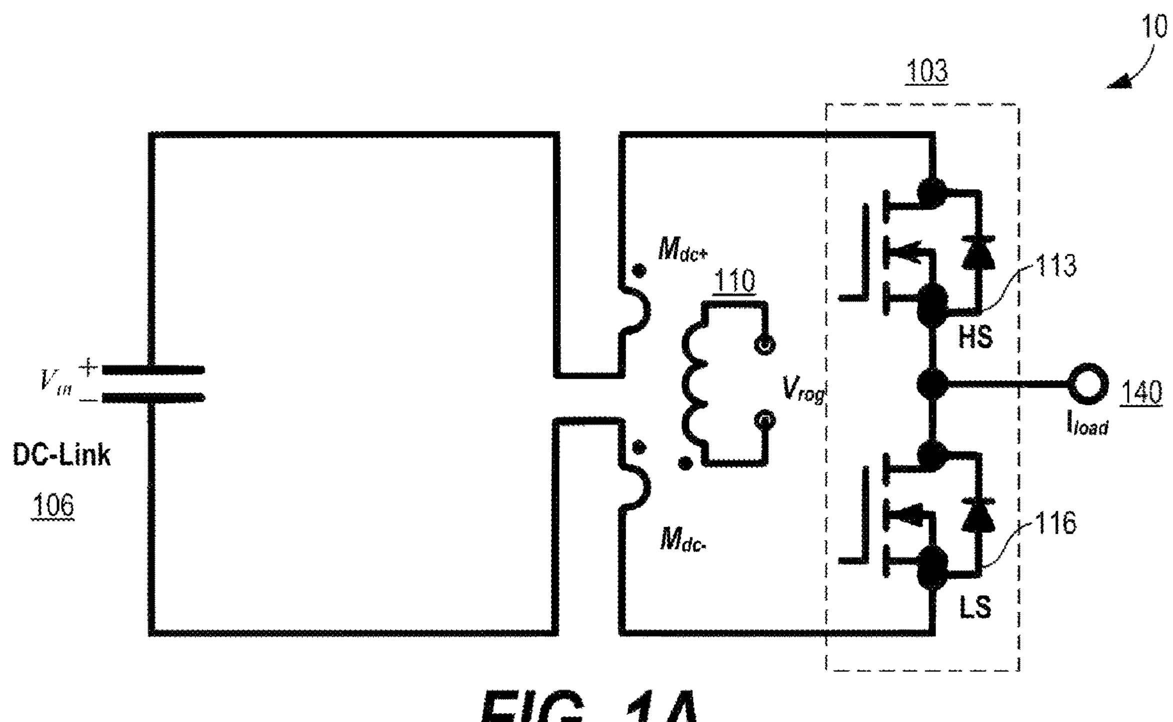
FIG. 1A depicts an example integrated current sensor, according to one or more embodiments of the present disclosure.

The present disclosure relates to a planar current sensor for power conversion and like applications. A Rogowski coil is a type of electrical device used for measuring alternating current (AC) or high-speed current pulses in electrical systems. Rogowski coils operate based on Faraday's law of electromagnetic induction. For example, when an AC current flows through a conductor, a magnetic field may be generated around the conductor. A Rogowski coil can measure the change in magnetic flux density around the conductor, and the changing magnetic flux density can induce a voltage in the Rogowski coil proportional to the rate of change of the current flowing through the conductor. By measuring the induced voltage in the Rogowski coil, parameters of the current (e.g., magnitude and phase) can be determined. Rogowski coils may be used in power quality monitoring for power conversion applications, protection purposes, energy metering, and other applications where precise measurements of AC currents or high-speed current pulses may be necessary.

Conventional Rogowski coils can include a helical coil of wire wound around a hollow core, which may be cylindrical, toroidal, or of any other shape. The core may not be ferromagnetic, making the coil inherently linear and sensitive to changes in magnetic flux. These Rogowski coils can vary in size based on the number of winding turns, the diameter of the coil, and the dimensions of the core. Some benefits of conventional Rogowski coils include support for high bandwidth (e.g., greater than 100 MHz), good integrability, and small footprint. However, these Rogowski coils can be bulky and require a large number of windings. Further, a bandwidth of Rogowski coils can be limited, and these coils can increase the current commutation loop.

Planar Rogowski coils can include flat windings patterned on a substrate material, such as a printed circuit board (PCB). Planar Rogowski coils can be compact compared to conventional Rogowski coils; however, integration of planar Rogowski coils into PCBs or like substrates for power conversion applications may be difficult. For example, conventional Rogowski coils integrated in a PCB are generally placed between metal-oxide-semiconductor field-effect transistors (MOSFETs) of a half-bridge and a direct current (DC)-bus, which can cause an increase in the current commutation loop stray inductance. Additionally, these Rogowski coils are typically placed around the current carrying trace, requiring a high number of windings and a large sensor area.

In other examples, conventional planar Rogowski coils can be integrated between the forward and return current trace as an alternative to a Rogowski coil wound around the conductor. However, these planar Rogowski coils are designed generally for a uniformly distributed current density through the current-carrying traces coupled with the planar Rogowski coil, whereas in high-density applications, the current density can be distributed non-uniformly through the DC-bus. In cases where current accumulates in the current-carrying traces non-uniformly (e.g., accumulating more in a left third portion or a right third portion, etc.), conventional planar Rogowski coils may measure the current inaccurately as the magnetic flux density change through winding turns of the short planar Rogowski coil may be small. Additionally, these planar Rogowski coils do not distinguish between a switching transient state, short circuit event, and/or a conduction state impact on the planar Rogowski coil output voltage.

In the context outlined above, one or more embodiments of the present disclosure include a PCB with integrated current sense. The PCB with integrated current sense can include a DC-bus including a first DC trace and a second DC trace. The current sensor can further include one or more planar Rogowski coils positioned between the first DC trace and the second DC trace that is electrically separated from the first DC trace and the second DC trace. The planar Rogowski coil can extend beyond or to an edge-to-edge distance between a first edge and a second edge of the first DC trace in a first direction. The planar Rogowski coil can also extend beyond an edge-to-edge distance between a first edge and a second edge of the second DC trace in the first direction. The PCB with integrated current sense can be configured to measure a switching transient current of a silicon carbide (SiC) MOSFET half-bridge, for example, while minimizing the current sensor's impact on current commutation loop stray inductance and parasitic elements. It should be noted that the PCB with integrated current sense can be configured to measure switching transient currents of any other transistor based half-bridges and not just SiC MOSFET half-bridges, such as insulated gate bipolar transistor (IGBT) half-bridges, Gallium Nitride (GaN) half-bridges, and hybrid half-bridges, among others.

The PCB with integrated current sense described in accordance with the various embodiments described herein can enable use of a single integrated planar Rogowski coil for current measuring for power conversion applications (e.g., half-bridge applications) within the PCB. The integrated planar Rogowski coil can have a length that further extends to or beyond a trace width of a DC-bus, enabling accurate current measurement even in cases of non-uniform current distribution through current carrying traces of the DC-bus. A longer planar Rogowski coil, extending to or beyond a trace width of the DC-bus, can have smaller current measurement errors than a short and centered planar Rogowski coil in cases of a non-uniformly distributed current density through the current carrying traces.

Additionally, the described planar Rogowski coil of the embodiments does not need to encircle the conducting DC traces for current measuring, enabling more freedom for placement of the planar Rogowski coil in various metal layers of the PCB with respect to the conducting DC traces. Overall, the PCB with integrated current sense can be compact and accurately measure switch current amplitude during turn-on and turn-off. Compared to conventional Rogowski coils and other planar Rogowski coils, the planar Rogowski coil of the PCB with integrated current sense has higher bandwidth, resulting in possibly more accurate current measurement during high-speed switching.

Figure 1B:
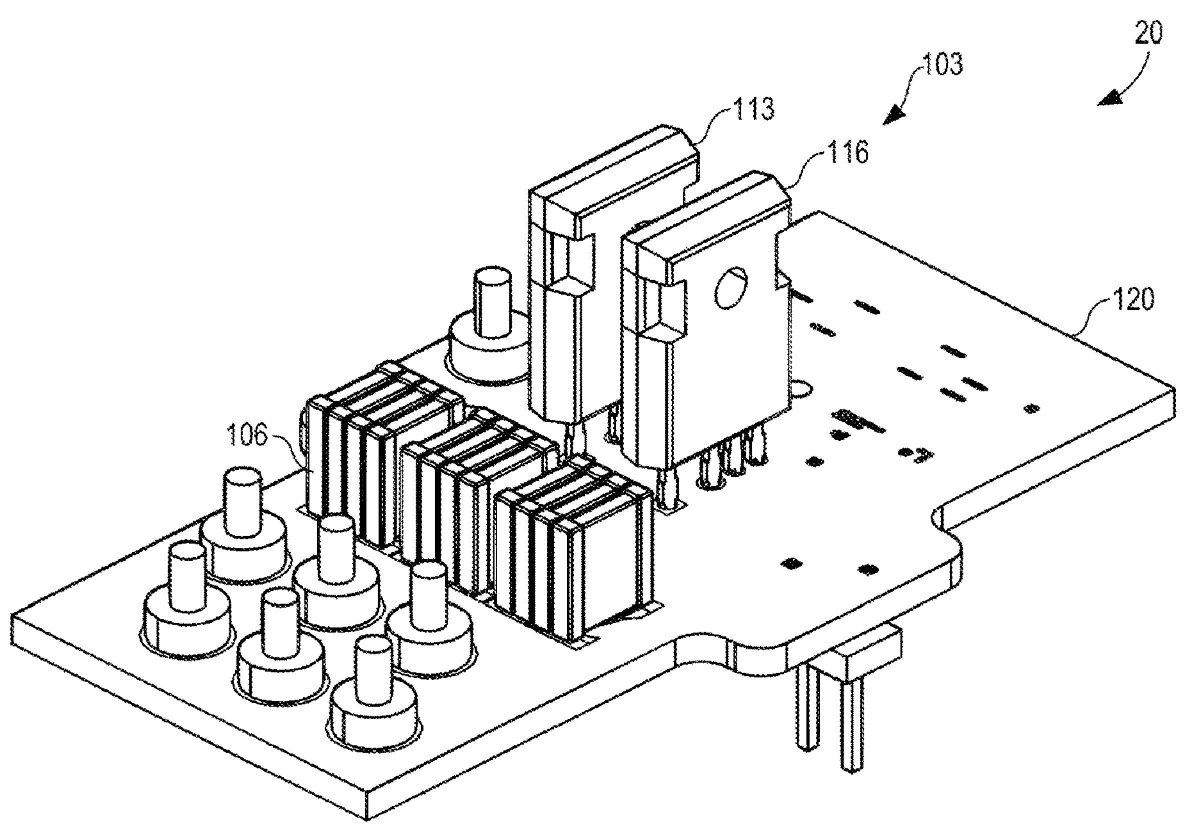
FIG. 1B depicts a PCB with integrated current sense that integrates the current sensor shown in FIG. 1A, according to one or more embodiments of the present disclosure.

Referring now to the drawings, FIG. 1A depicts an example integrated current sensor 10, and FIG. 1B depicts a PCB with integrated current sense 20 that integrates the integrated current sensor 10, according to one or more embodiments of the present disclosure. The integrated current sensor 10 can include a planar Rogowski coil 110, a DC-bus 201 (shown in FIG. 2), one or more switching transistors 103, and a DC-Link 106. The one or more switching transistors 103 can be transistors of a half-bridge including a high-side MOSFET 113 and a low-side MOSFET 116. However, other combinations of MOSFETs and other types of transistors can be employed. Although one planar Rogowski coil (e.g., the planar Rogowski coil 110) is illustrated in FIG. 1, it should be noted that multiple planar Rogowski coils can be implemented in the PCB with integrated current sense 20 between conducting traces of the DC-bus 201, where sensing current through each phase of a multiphase power converter may be necessary.

Figure 2:
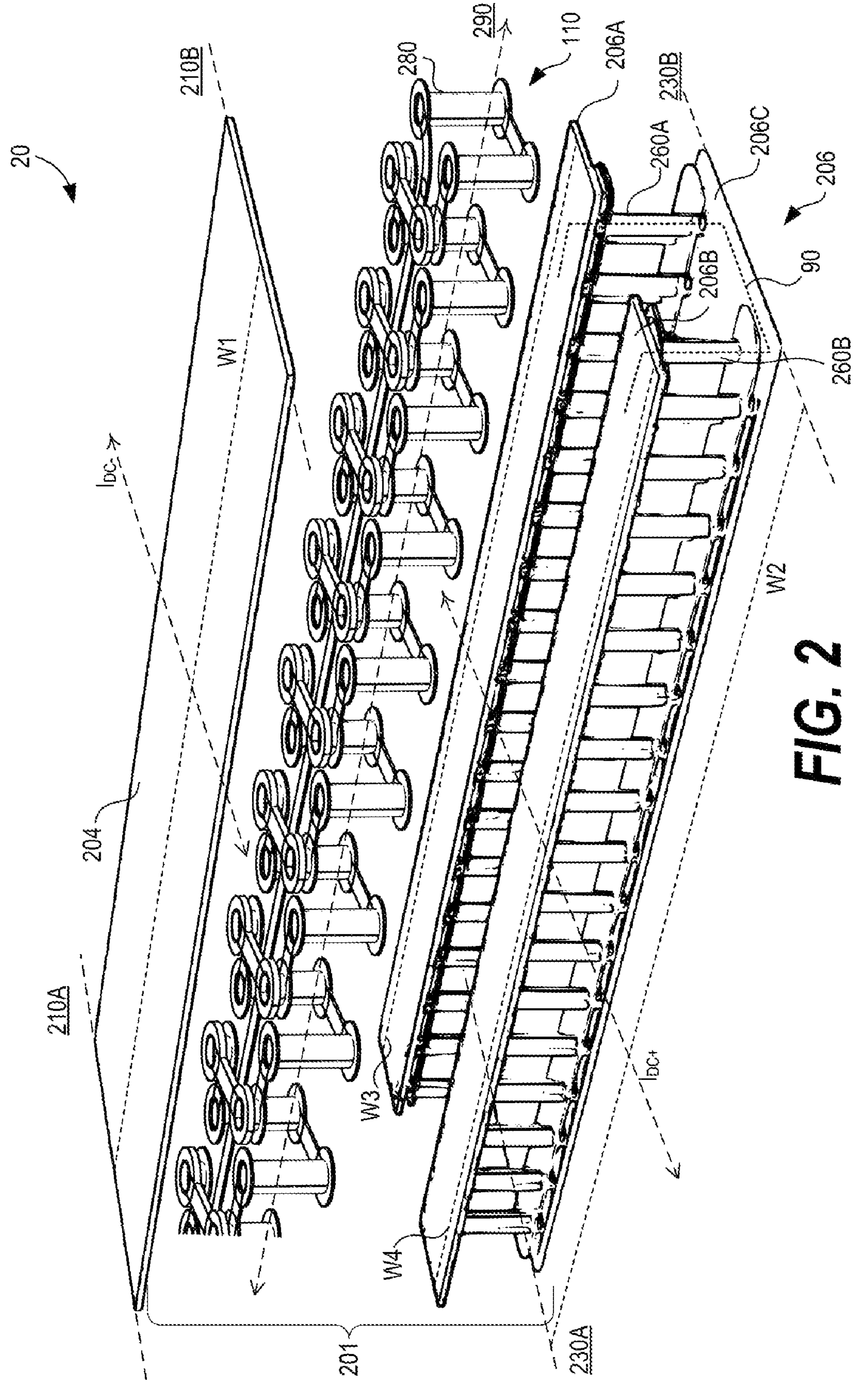
FIG. 2 depicts an exploded view of the PCB with integrated current sense shown in FIG. 1B, according to one or more embodiments of the present disclosure.

The DC-bus 201 (shown in FIG. 2) can include a first DC trace 204 (shown in FIG. 2) and a second DC trace 206 (shown in FIG. 2). The first DC trace 204 can be connected to a negative input of the DC-Link 106 and facilitate transfer of DC− current (e.g., $I_{DC-}$). The second DC trace 206 can be connected to a positive input of the DC-Link 106 and facilitate transfer of DC+ current (e.g., $I_{DC+}$). As such, the first DC trace 204 can be a DC− trace, and the second DC trace 206 can be a DC+ trace. However, the polarities of current flowing through the first DC trace 204 and the second DC trace 206 can be reversed depending on connection to the DC-Link 106, and the first DC trace 204 can be a DC+ trace and the second DC trace 206 can be a DC-trace in some examples. Additionally, the DC-Link 106 can be replaced with one or more decoupling capacitors in various examples.

The integrated current sensor 10 is provided as a representative example of implementation of the planar Rogowski coil 110, with other various components such as the one or more switching transistors 103 and the DC-Link 106. For example, as illustrated, the planar Rogowski coil 110 can be implemented for sensing various changes in current flowing through the first DC trace 204 and the second DC trace 206 (shown in FIG. 2) for a half-bridge including the one or more switching transistors 103. In some examples, the integrated current sensor 10 can be implemented as a current sensor for other types of power converter applications other than half-bridge applications, such as other non-isolated power converters such as buck, boost, buck-boost, and Cuk power converters. As such, the integrated current sensor 10 can include other components that are not illustrated in FIG. 1A, such as additional output converter stages, capacitors, inductors, active devices (e.g., transistors, diodes, etc.), and other components. Similarly, one or more of the components shown in FIG. 1A can be omitted in some cases. In addition, the integrated current sensor 10 can be implemented using a combination of integrated and discrete circuit components, for example, in one or more PCBs as shown in FIG. 1B.

The DC-bus 201 can be connected to the DC-Link 106 to provide power to the various components of the integrated current sensor 10, including the one or more switching transistors 103 and a load 140. For example, the second DC trace 206 of the DC-bus 201 can be connected to a positive input of the DC-Link 106 and the high-side MOSFET 113, and the first DC trace 204 of the DC-bus 201 can be connected to a negative input of the DC-Link 106 and the low-side MOSFET 116.

The integrated current sensor 10 can be configured to measure a magnetic flux density change through a winding area of the planar Rogowski coil 110 induced by the change in current through the multiple DC traces 204 and 206 of the DC-bus 201 (shown in FIG. 2). Each DC trace (e.g., the first DC trace 204 and the second DC trace 206) can be configured to have a specific mutual inductance coupling to the planar Rogowski coil 110, inducing an output voltage in the planar Rogowski coil 110. As such, the output voltage of the planar Rogowski coil 110 can depend on both the mutual inductance coupling of the multiple DC traces (e.g., the first DC trace 204 and the second DC trace 206) to the planar Rogowski coil 110 and the corresponding change in current through the multiple DC traces 204 and 206. Thus, the equivalent equation for the output voltage of the planar Rogowski coil 110 is:

$$v_{rog} = M_{dc+} \cdot \frac{di_{dc+}}{dt} + M_{dc-} \cdot \frac{di_{dc-}}{dt}, \quad (1)$$

where $M_{dc+}$ is the mutual inductance between the second DC trace 206 of the DC-bus 201 and the planar Rogowski coil 110, $$\frac{di_{dc+}}{dt}$$

is the DC+ current change through the second DC trace 206, $M_{dc-}$ is the mutual inductance between the first DC trace 204 of the DC-bus 201, and $$\frac{di_{dc-}}{dt}$$

is the DC-current change through the first DC trace 204. The first DC trace 204 and the second DC trace 206 in the DC-bus 201 are positioned as close as possible to each other (e.g., decrease the area between the first DC trace 204 and the second DC trace 206) to cause a larger mutual inductance cancellation between the two DC traces 204 and 206 and additionally decrease the current commutation loop stray inductance.

The planar Rogowski coil 110 can be configured to generate an output voltage based on a change in magnetic flux density through one or more winding turns of the planar Rogowski coil 110, where the change in magnetic flux density can be induced by a change in current through at least one of the first DC trace 204 or the second DC trace 206.

The planar Rogowski coil 110 can be further configured to operate in three or more operating states. In a first operating state, the planar Rogowski coil 110 can be configured to measure continuous current with a relatively small change in di/dt through one of the DC traces 204 or 206 of the DC-bus 201, as observed in a buck converter or inverter applications. In a second operating state, the planar Rogowski coil 110 can be configured to measure half-bridge switching transient of the one or more switching transistors 103. In a third operating state, the planar Rogowski coil 110 can be configured to measure a short circuit event for various power converter applications, including the half-bridge for the one or more switching transistors 103. Directions of the current flowing through the first DC trace 204 and the second DC trace 206 can depend on the operating states discussed above.

The PCB with integrated current sense 20 in FIG. 1B is provided as a representative example for implementing the integrated current sensor 10 in a PCB 120. The PCB with integrated current sense 20 can include other components that are not illustrated in FIG. 1B, such as additional output converter stages, capacitors, inductors, active devices (e.g., transistors, diodes, etc.), and other components. Similarly, one or more of the components shown in FIG. 1B can be omitted in some cases. For example, the one or more switching transistors 103 and the DC-Link 106 are populated in the PCB 120 through one or more contacts. In various examples, the one or more switching transistors 103 and the DC-Link 106 can be unpopulated from the PCB 120. The planar Rogowski coil 110 can be positioned between the DC-Link 106 and the one or more switching transistors 103 as shown in FIGS. 1A and 1B. In the PCB with integrated current sense 20 shown in FIG. 1B, the planar Rogowski coil 110 is not visible but is located in the PCB with integrated current sense 20 between the DC-Link 106 and the one or more switching transistors 103.

The PCB 120 can include any number of metal layers in the stack, as needed, to implement the planar Rogowski coil 110 and the DC-bus 201 described herein, along with dielectric insulating materials among them in a laminated structure. For example, the planar Rogowski coil 110 and the DC-bus 201 can be integrated in multiple metal layers of the PCB 120 and electrically separated or connected using through-PCB vias and metal traces. Typical substrate material for the PCB 120 can include alumina, silicon, and polytetrafluoroethylene (PTFE) materials, among others. Glass-reinforced epoxy laminate (e.g., FR4 laminate) is a common material in printed circuit boards (PCBs), but a range of other dielectric materials can be relied upon. The PCB with integrated current sense 20 can be used to measure current accurately over a wide bandwidth range, while having minimal impact on the power circuit and incorporates a small size. A more detailed description of integration of the structure and function of the planar Rogowski coil 110 in the PCB with integrated current sense 20 is provided below.

Figure 3:
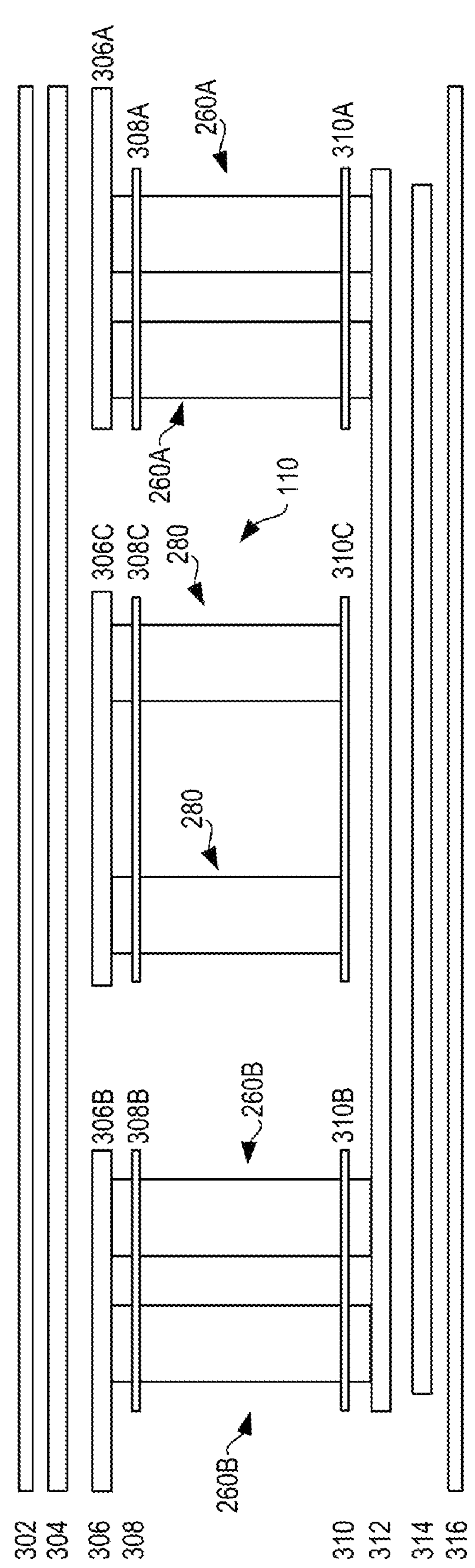
FIG. 3 depicts a cross-sectional front view of the PCB with integrated current sense shown in FIG. 2, according to one or more embodiments of the present disclosure.

FIG. 2 depicts an exploded view of the PCB with integrated current sense 20 including the DC-bus 201 and the planar Rogowski coil 110, and FIG. 3 depicts a cross-sectional front view of the PCB with integrated current sense 20 illustrated in FIG. 2, according to one or more embodiments of the present disclosure. The DC-bus 201 and the planar Rogowski coil 110 illustrated in FIGS. 2 and 3 are not necessarily drawn to any particular scale or size. Additionally, FIGS. 2 and 3 are not exhaustively illustrated, meaning that other components that are not shown in FIGS. 2 and 3 can be included or relied upon in some cases. Similarly, one or more of the components shown in FIGS. 2 and 3 can be omitted in some cases.

The DC-bus 201 includes the first DC trace 204 and the second DC trace 206. The first DC trace 204 can be substantially planar or rectangular in shape, although other shapes and sizes can be relied upon. The first DC trace 204 extends from a first side edge 210A to a second side edge 210B. An edge-to-edge distance W1 is defined as the distance between the first side edge 210A and the second side edge 210B. The edge-to-edge distance W1 can also correspond to the trace width of the first DC trace 204.

The second DC trace 206 is defined by a first trace region 206A, a second trace region 206B, and a third trace region 206C, which all can be electrically connected with a plurality of vias (e.g., through-PCB vias) 260A and 260B. The plurality of vias 260A can extend from the second side edge 230B to the first side edge 230A and facilitate electrical connection between the first trace region 206A and the third trace region 206C. The plurality of vias 260B can extend from the second side edge 230B to the first side edge 230A and facilitate electrical connection between the second trace region 206B and the third trace region 206C.

An electrical connection 90 enables a DC+ current (e.g., $I_{DC+}$) to flow between the first trace region 206A, the second trace region 206B, and the third trace region 206C. The third trace region 206C extends from a first side edge 230A to a second side edge 230B. An edge-to-edge distance W2 is defined as the distance between the first side edge 230A to the second side edge 230B. The edge-to-edge distance W2 can also correspond to the trace width of the third trace region 206C and of the second DC trace 206. The edge-to-edge distance W1 and the edge-to-edge distance W2 can be equal or substantially similar. However, in some embodiments, the edge-to-edge distance W1 and the edge-to-edge distance W2 can be different from each other. The trace width W2, trace width W3 of the first trace region 206A, and trace width W4 of the second trace region 206B can be equal. However, in some embodiments, the trace widths W2, W3, and W4 can be different from each other.

The first trace region 206A, the second trace region 206B, and the third trace region 206C can be substantially planar or rectangular in shape, although other shapes and sizes can be relied upon. For example, the first trace region 206A and the second trace region 206B can be identical. The shape of the second DC trace 206 can be defined by a connection of the first trace region 206A, the second trace region 206B, and the third trace region 206C by, for example, the electrical connection 90. In FIG. 2, the shape of the second trace 206 can take the form of a "U"-like shape.

The planar Rogowski coil 110 extends linearly along an axis of extension or winding axis 290. For example, the planar Rogowski coil 110 can include multiple winding turns of trace material extending along the axis of extension 290 through various metal layers and plurality of vias 280 of the PCB 120. For example, a single winding turn of the multiple winding turns can extend along the axis of extension 290 and through multiple layers of the PCB 120 by way of the plurality of vias 280, which can also extend along the axis of extension 290. Additional detail regarding paths and/or structure of the winding turns of the planar Rogowski coil 110 is provided with respect to FIGS. 3 and 4.

The planar Rogowski coil 110 can extend beyond or to the edge-to-edge distances W1, W2, W3, and/or W4. For example, a length of the planar Rogowski coil 110 that extends in the direction of the axis of extension 290 can be longer than the edge-to-edge distances W1, W2, W3, and/or W4. The planar Rogowski coil 110 can extend along the axis of extension 290 beyond both the first side edge 210A and the second side edge 210B and/or beyond the first side edge 230A and the second side edge 230B. In some embodiments, the length the planar Rogowski coil 110 that extends beyond the first side edge 210A and the first side edge 230A can be greater than the length the planar Rogowski coil 110 that extends beyond the second side edge 210B and the second side edge 230B, and vice-versa. In other examples, the length the planar Rogowski coil 110 extends beyond the first side edge 210A and the first side edge 230A can be equal to the length the planar Rogowski coil 110 extends beyond the second side edge 210B and the second side edge 230B.

The planar Rogowski coil 110 is positioned between the first DC trace 204 and the second DC trace 206. Additionally, the planar Rogowski coil 110 can be positioned between the first trace region 206A and the second trace region 206B. The planar Rogowski coil 110 is magnetically coupled to the first DC trace 204 and the second DC trace 206. The first DC trace 204 can be electrically coupled between at least one contact for the one or more switching transistors 103 and at least one contact for the DC-Link 106. The second DC trace 206 can be electrically coupled between at least one contact for the one or more switching transistors 103 and at least one contact for the DC-Link 106.

The first DC trace 204, the second DC trace 206, and the planar Rogowski coil 110 can be implemented in various metal layers of the PCB 120. A minimum of four PCB layers can be required to implement the DC-bus 201 and the planar Rogowski coil 110 but greater than four PCB layers can be used. Referring to FIG. 3, an eight-layer PCB structure is provided, by way of a non-limiting example for implementing the DC-bus 201 and the planar Rogowski coil 110. For example, the PCB 120 can have multiple layers including a first layer 302, a second layer 304, a third layer 306, a fourth layer 308, a fifth layer 310, a sixth layer 312, a seventh layer 314, and an eighth layer 316, for an eight-layer PCB stack-up. The second layer 304 can be a first intermediate layer that can include the first DC trace 204, the third layer 306 can be a second intermediate layer that can include the second DC trace 206, and the sixth layer 312 can be a third intermediate layer that can also include the second DC trace 206.

The second intermediate layer corresponding to the third layer 306 can have a first separate region 306A, a second separate region 306B, and a third separate region 306C. The first separate region 306A can include the first trace region 206A, the second separate region 306B can include the second trace region 206B, and the third separate region 306C is a middle region among the three regions 306A, 306B, and 306C, and can include a portion of a winding of the planar Rogowski coil 110.

The fourth layer 308 can be the first metal layer between the second intermediate layer (e.g., corresponding to the third layer 306) and the third intermediate layer (e.g., corresponding to the sixth layer 312) and can include a first separate region 308A, a second separate region 308B, and a third separate region 308C. The fifth layer 310 is a second metal layer between the first metal layer (e.g., corresponding to the fourth layer 308) and the third intermediate layer (e.g., corresponding to the sixth layer 312). The fifth layer 310 can include a first separate region 310A, a second separate region 310B, and a third separate region 310C. The first intermediate layer (e.g., corresponding to the second layer 304) and the second intermediate layer (e.g., corresponding to the third layer 306) are adjacent layers. The planar Rogowski coil 110 can be positioned between the first intermediate layer (e.g., corresponding to the second layer 304) and the third intermediate layer (e.g., corresponding to the sixth layer 312). The multiple winding turns of the planar Rogowski coil 110 can wind axially along the winding axis 290 between the second intermediate layer (e.g., the third separate region 306C) and the second metal layer (e.g., the third separate region 310C) and also through the third separate region 308C.

The first separate region 306A is electrically connected to the third intermediate layer (e.g., corresponding to the sixth layer 312) through the plurality of vias 260A, and the second separate region 306B is also electrically connected to the third intermediate layer (e.g., corresponding to the sixth layer 312) through the plurality of vias 260B. The third separate region 306C can be electrically connected to the third separate region 310C through the plurality of vias 280.

Figure 4:
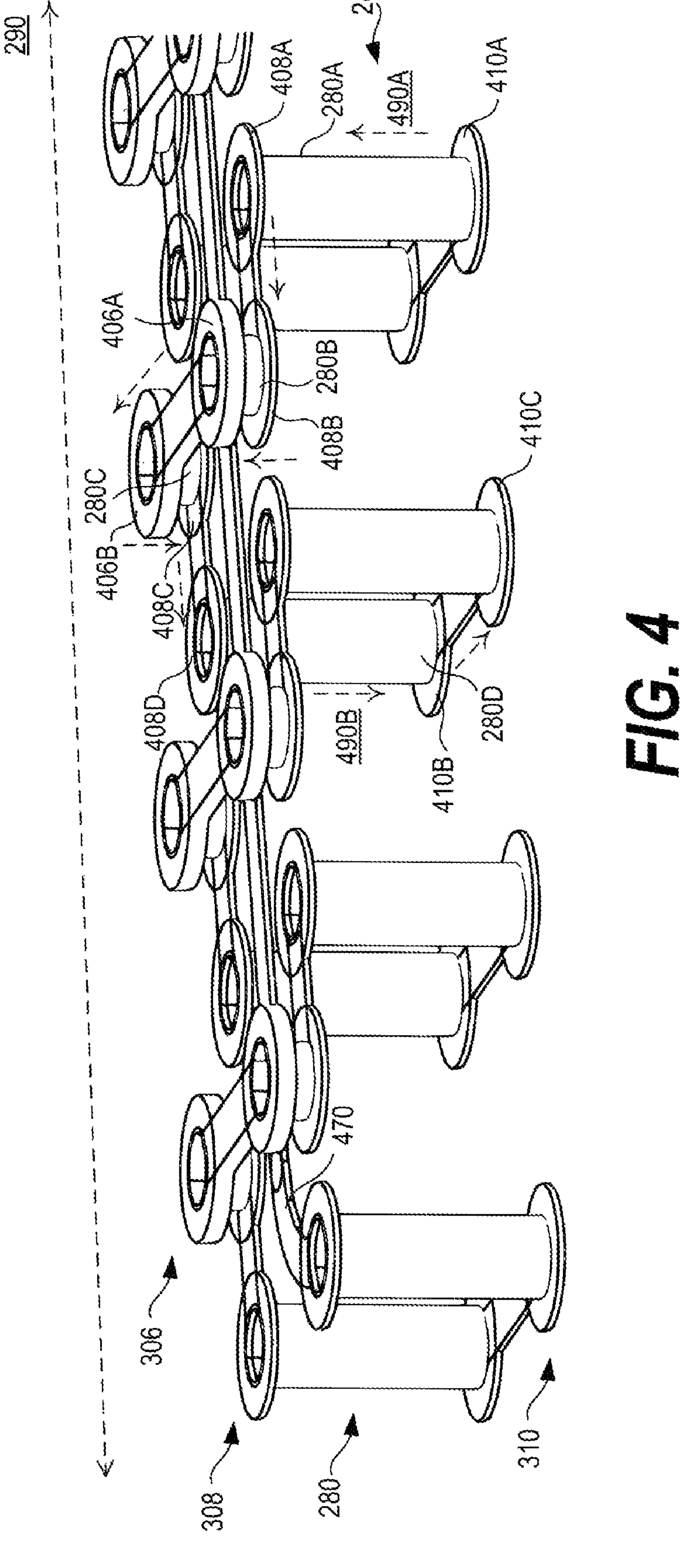
FIG. 4 depicts a rotated side view of the planar Rogowski coil shown in FIG. 2, according to one or more embodiments of the present disclosure.

FIG. 4 depicts a rotated side view of the planar Rogowski coil 110 shown in FIG. 2, according to one or more embodiments of the present disclosure. As discussed above, the planar Rogowski coil 110 can include multiple winding turns of trace material extending along the axis of extension 290 through various metal layers and through-PCB vias of the PCB 120. For example, as illustrated in FIG. 4, the planar Rogowski coil 110 extends vertically from the third separate region 310C to the third separate region 306C and further extends linearly along the axis of extension 290. In the following description, an extension path of a single winding turn among the multiple winding turns of the planar Rogowski coil 110 is provided. It should be noted that the planar Rogwoski coil 110 can include any number of winding turns depending on application of the planar Rogowski coil 110.

For example, a single winding turn of the planar Rogowski coil 110 can extend vertically in a first direction 490A from a first portion 410A of the second metal layer (e.g., corresponding to the fifth layer 310) to a first portion 408A of the first metal layer (e.g., corresponding to the fourth layer 308) through a first via 280A of the plurality of vias 280. Next, the single winding turn can extend transversely from the first portion 408A to a second portion 408B of the first metal layer (e.g., corresponding to the fourth layer 308). Next, the single winding turn can extend vertically in the first direction 490A from the second portion 408B to a first portion 406A of the second intermediate layer (e.g., corresponding to the third layer 306) through a second via 280B of the plurality of vias 280. Next, the single winding turn can extend transversely from the first portion 406A to a second portion 406B of the second intermediate layer (e.g., corresponding to the third layer 306). Next, the single winding turn can extend vertically in a second direction 490B, opposite of the first direction 490A, from the second portion 406B to a third portion 408C of the first metal layer (e.g., corresponding to the fourth layer 308) through a third via 280C of the plurality of vias 280. Next, the single winding turn can extend transversely from the third portion 408C to a fourth portion 408D of the first metal layer (e.g., corresponding to the fourth layer 308). Next, the single winding turn can extend vertically in the second direction 490B from the fourth portion 408D to a second portion 410B of the second metal layer (e.g., corresponding to the fifth layer 310) through a fourth via 280D of the plurality of vias 280. The single winding turn can then extend from the second portion 410B to a third portion 410C of the second metal layer (e.g., corresponding to the fifth layer 310). The single winding turn is not limited to the above-described extension pattern. In some examples, the single winding turn may be shorter or simpler (e.g., extend less along the axis of extension 290). For example, instead of ending at the third portion 410C as described, the single winding turn can end at the second portion 410B or the fourth portion 408D, among other locations. The extension pattern of the single winding turn can be adjusted depending on the application for use of the PCB with integrated current sense 20.

The extension pattern described above of a single winding turn of the multiple winding turns of the planar Rogowski coil 110 can be repeated for other winding turns of the planar Rogowski coil 110. For example, other winding turns of the multiple winding turns can overall extend vertically between the second metal layer (e.g., corresponding to the fifth layer 310) and the second intermediate layer (e.g., corresponding to the third layer 306) and extend linearly along the axis of extension 290.

Figure 5:
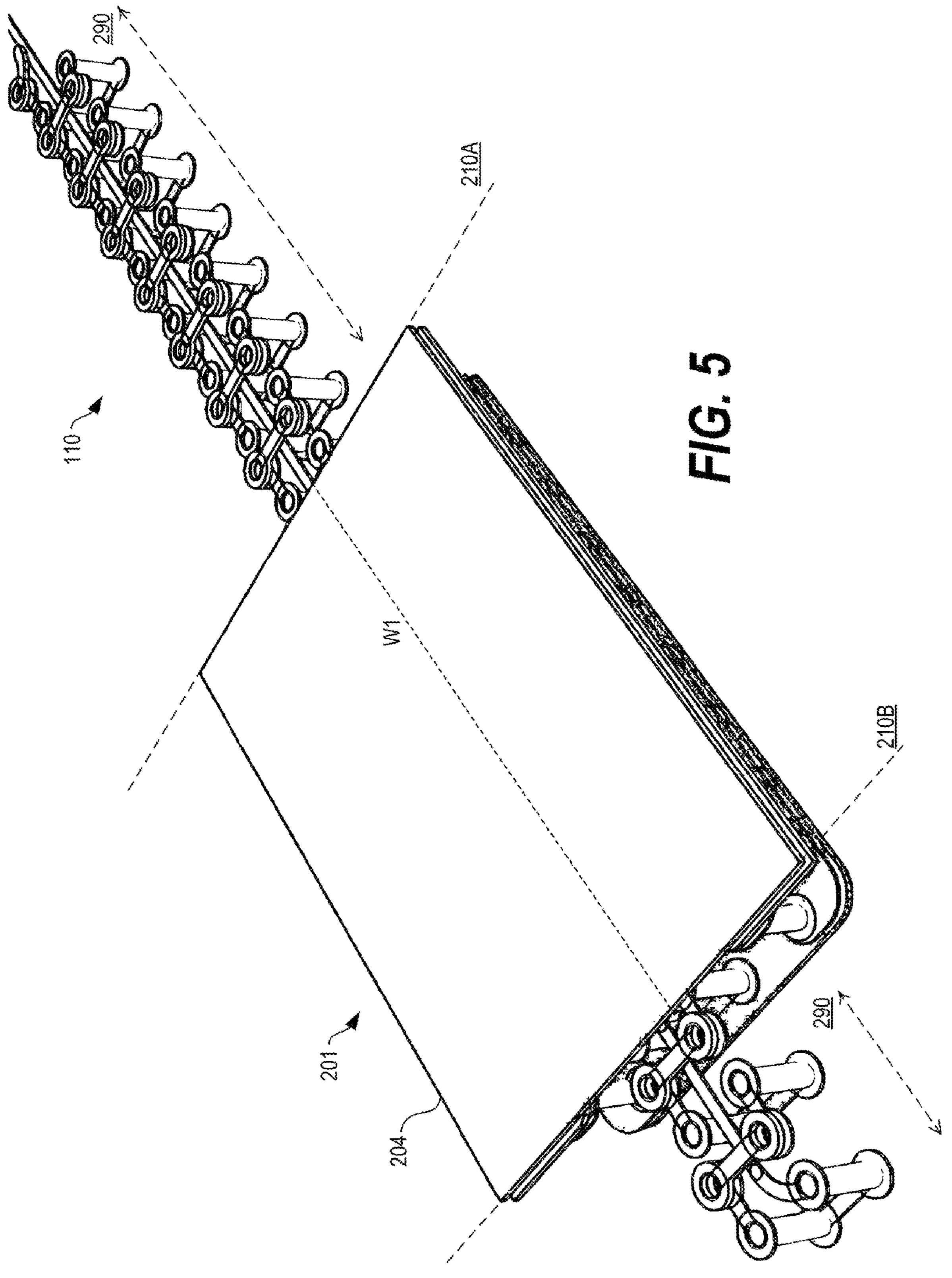
FIG. 5 depicts a top-down view of the PCB with integrated current sense shown in FIG. 2, according to one or more embodiments of the present disclosure.

FIG. 5 depicts a top-down view of the PCB with integrated current sense 20 shown in FIG. 2, according to one or more embodiments of the present disclosure. The DC-bus 201 and the planar Rogowski coil 110 illustrated in FIG. 5 are not necessarily drawn to any particular scale or size. Additionally, FIG. 5 is not exhaustively illustrated, meaning that other components that are not shown in FIG. 5 can be included or relied upon in some cases. Similarly, one or more of the components shown in FIG. 5 can be omitted in some cases. As discussed previously, the DC-bus 201 includes the first DC trace 204 and the second DC trace 206, and the edge-to-edge distance W1 (e.g., corresponding to the trace width) of the first DC trace 204 can be defined as the distance between the first side edge 210A and the second side edge 210B. The edge-to-edge distance W1 can be equal to or different from the edge-to-edge distance W2 (e.g., corresponding to the trace width) of the second DC trace 206. Additionally, the length of the planar Rogowski coil 110 extending in the direction of the axis of extension 290 can be longer than the edge-to-edge distance W1 as depicted.

In FIG. 5, the planar Rogowski coil 110 extends further beyond the first side edge 210A than beyond the second side edge 210B. However, as discussed previously, the length the planar Rogowski coil 110 that extends beyond the first side edge 210A and the length the planar Rogowski coil 110 that extends beyond the second side edge 210B can be equal or longer in one direction than the other. In various examples, the length the planar Rogowski coil 110 that extends beyond the first side edge 210A and the length the planar Rogowski coil 110 that extends beyond the second side edge 210B may correspond to a length of one winding turn of the multiple winding turns of the planar Rogowski coil 110 extending along the axis of extension 290. In some embodiments, the length of the planar Rogowski coil 110 can be equal to the edge-to-edge distance W1 (e.g., corresponding to the trace width) of the first DC trace 204.

Overall, the use of a longer planar Rogowski coil (e.g., the planar Rogowski coil 110) in the PCB with integrated current sense 20 enables accurate current measurement even in cases of non-uniform current distribution through the DC traces of the DC-bus of the PCB with integrated current sense 20. Additionally, the described planar Rogowski coil 110 does not need to encircle the DC traces for current measuring and/or sensing, enabling more freedom for placement of the planar Rogowski coil 110. The PCB with integrated current sense 20 is compact overall and can accurately measure switch current amplitude during turn-on and turn-off. The PCB with integrated current sense 20 has higher bandwidth, resulting possibly a more accurate current measurement during high-speed switching compared to conventional Rogowski coils and other planar Rogowski coils.

In addition, the planar Rogowski coil 110 can accurately measure switch current amplitude. The placement of the planar Rogowski coil 110 in the PCB with integrated current sense 20 enables different sensor gains depending on the operating state of the planar Rogowski coil 110. Furthermore, the impact of the planar Rogowski coil 110 on the current commutation loop stray inductance is small. The integrated nature of the planar Rogowski coil 110 in the PCB with integrated current sense 20 can amplify the parasitic capacitance between the planar Rogowski coil 110 and the DC traces 204 and 206.

The features, structures, and components described above may be combined in one or more embodiments in any suitable manner, and the features discussed in the various embodiments are interchangeable, where technically suitable. In the foregoing description, certain details are provided convey the concepts of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as “on,” “below,” “upper,” “lower,” “top,” “bottom,” “right,” and “left” may be used to describe the relative spatial relationships of certain structural features, these terms are used for convenience only, as a direction in the examples. It should be understood that if the device is turned upside down, the “upper” component will become a “lower” component. When a structure or feature is described as being “over” (or formed over) another structure or feature, the structure can be positioned over the other structure, with or without other structures or features intervening between them. When two components are described as being “coupled to” each other, the components can be electrically coupled to each other, with or without other components being electrically coupled and intervening between them. When two components are described as being “directly coupled to” each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified.

Combinatorial language, such as "at least one of X, Y, and Z" or "at least one of X, Y, or Z," unless indicated otherwise, is used in general to identify one, a combination of any two, or all three (or more if a larger group is identified) thereof, such as X and only X, Y and only Y, and Z and only Z, the combinations of X and Y, X and Z, and Y and Z, and all of X, Y, and Z. Such combinatorial language is not generally intended to, and unless specified does not, identify or require at least one of X, at least one of Y, and at least one of Z to be included. The terms "about" and "substantially," unless otherwise defined herein to be associated with a particular range, percentage, or related metric of deviation, account for at least some manufacturing tolerances between a theoretical design and manufactured product or assembly, such as the geometric dimensioning and tolerancing criteria described in the American Society of Mechanical Engineers (ASME®) Y14.5 and the related International Organization for Standardization (ISO®) standards. Such manufacturing tolerances are still contemplated, as one of ordinary skill in the art would appreciate, although "about," "substantially," or related terms are not expressly referenced, even in connection with the use of theoretical terms, such as the geometric "perpendicular," "orthogonal," "vertex," "collinear," "coplanar," and other terms.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

The invention claimed is:

1. A printed circuit board (PCB) with integrated current sense, comprising:

a direct current (DC) bus comprising a first DC trace and a second DC trace;

a planar Rogowski coil positioned between the first DC trace and the second DC trace that is electrically separated from the first DC trace and the second DC trace, wherein the planar Rogowski coil extends beyond an edge-to-edge distance between a first side edge and a second side edge of the first DC trace in a first direction.

2. The PCB with integrated current sense of claim 1, wherein the edge-to-edge distance of the first DC trace equals the edge-to-edge distance of the second DC trace.

3. The PCB with integrated current sense of claim 1, wherein:

the planar Rogowski coil is magnetically coupled to the first DC trace and the second DC trace;

the first DC trace is electrically coupled between at least one contact for one or more switching transistors of a half-bridge and at least one contact for a DC-Link; and the second DC trace is electrically coupled between at least one contact for the one or more switching transistors of the half-bridge and at least one contact for the DC-Link.

4. The PCB with integrated current sense of claim 1, wherein the planar Rogowski coil is magnetically coupled to the first DC trace and the second DC trace, and the first DC trace and the second DC trace are electrically coupled between one or more switching transistors and a DC-Link.

5. The PCB with integrated current sense of claim 4, wherein the planar Rogowski coil is configured to generate an output voltage based on a change in magnetic flux density through one or more winding turns of the planar Rogowski coil, the change in magnetic flux density induced by a change in current through at least one of the first DC trace or the second DC trace.

6. The PCB with integrated current sense of claim 5, wherein the planar Rogowski coil is further configured to measure:

a continuous current conduction through the first DC trace or the second DC trace based on a conduction of the one or more switching transistors;

a switching transient of the one or more switching transistors; or a short circuit event of a half-bridge.

7. The PCB with integrated current sense of claim 1, further comprising a plurality of layers, the plurality of layers comprising:

a first intermediate layer comprising the first DC trace;

a second intermediate layer comprising the second DC trace; and a third intermediate layer comprising the second DC trace.

8. The PCB with integrated current sense of claim 7, wherein:

the first intermediate layer and the second intermediate layer are adjacent layers; and the planar Rogowski coil is positioned between the first intermediate layer and the third intermediate layer.

9. The PCB with integrated current sense of claim 7, wherein the plurality of layers further comprises:

a first metal layer between the second intermediate layer and the third intermediate layer; and a second metal layer between the first metal layer and the third intermediate layer.

10. The PCB with integrated current sense of claim 9, wherein a plurality of winding turns of the planar Rogowski coil wind axially along a winding axis of the planar Rogowski coil between the second metal layer and the second intermediate layer.

11. The PCB with integrated current sense of claim 10, wherein a winding turn among the plurality of winding turns of the planar Rogowski coil:

extends vertically in a first direction from a first portion of the second metal layer to a first portion of the first metal layer through a first via;

extends transversely from the first portion of the first metal layer to a second portion of the first metal layer;

extends vertically in the first direction from the second portion of the first metal layer to a first portion of the second intermediate layer through a second via;

extends transversely from the first portion of the second intermediate layer to a second portion of the second intermediate layer;

extends vertically in a second direction opposite to the first direction from the second portion of the second intermediate layer to a third portion of the first metal layer through a third via;

extends transversely from the third portion of the first metal layer to a fourth portion of the first metal layer;

extends vertically in the second direction from the fourth portion of the first metal layer to a second portion of the second metal layer through a fourth via;

and extends transversely from the second portion of the second metal layer to a third portion of the second metal layer.

12. The PCB with integrated current sense of claim 7, wherein:

the second intermediate layer comprises three separate regions;

two regions among the three separate regions comprise the second DC trace; and a third region of the three separate regions comprises a portion of a winding of the planar Rogowski coil.

13. The PCB with integrated current sense of claim 12, wherein the third region is a middle region of the three separate regions and between the two regions.

14. The PCB with integrated current sense of claim 7, wherein the second intermediate layer and the third intermediate layer are electrically connected by one or more vias.

15. The PCB with integrated current sense of claim 14, wherein a shape of the second DC trace is defined by a connection of the second intermediate layer to the third intermediate layer through the one or more vias.

16. The PCB with integrated current sense of claim 1, wherein the planar Rogowski coil extends beyond the edge-to-edge distance of the first DC trace and the edge-to-edge distance of the second DC trace by approximately a length of one winding turn beyond each edge of the first DC trace and beyond each edge of the second DC trace.

17. The PCB with integrated current sense of claim 1, wherein the planar Rogowski coil extends beyond an edge-to-edge distance between a first edge and a second edge of the second DC trace in the first direction.

18. A printed circuit board (PCB) with integrated current sense, comprising:

a direct current (DC) bus comprising a first DC trace and a second DC trace; and a planar Rogowski coil positioned between the first DC trace and the second DC trace, wherein:

the planar Rogowski coil extends to an edge-to-edge distance between a first side edge and a second side edge of the first DC trace in a first direction; and the planar Rogowski coil extends to an edge-to-edge distance between a first side edge and a second side edge of the second DC trace in the first direction.

19. The PCB with integrated current sense of claim 18, wherein the planar Rogowski coil is magnetically coupled to the first DC trace and the second DC trace, and the first DC trace and the second DC trace are electrically coupled between one or more switching transistors and a DC-Link.

20. The PCB with integrated current sense of claim 18, further comprising a plurality of layers, the plurality of layers comprising:

a first intermediate layer comprising the first DC trace;

a second intermediate layer comprising the second DC trace; and a third intermediate layer comprising the second DC trace.

* * * * *